United States Patent [19]

Deveaud-Pledran et al.

[11] Patent Number: 5,296,699
[45] Date of Patent: Mar. 22, 1994

[54] QUANTUM WELL PHOTOELECTRIC DETECTOR WITH IMPROVED DETECTIVITY

[75] Inventors: Benoît Deveaud-Pledran, Lannion; Jean-Michel Gerard, Paris, both of France

[73] Assignee: France Telecom, France

[21] Appl. No.: 18,116

[22] Filed: Feb. 17, 1993

[30] Foreign Application Priority Data

Feb. 18, 1992 [FR] France ................. 92 01826

[51] Int. Cl.$^5$ ............................................. H01J 40/14
[52] U.S. Cl. ..................... 250/214.1; 257/21
[58] Field of Search .................. 250/208.1, 226, 214.1; 257/14, 17, 21, 22

[56] References Cited

U.S. PATENT DOCUMENTS 4,873,555 10/1989 Coon et al. .................. 357/16
5,023,673 6/1991 McCall et al. ............... 250/214.1

FOREIGN PATENT DOCUMENTS 463907 1/1992 European Pat. Off. .

OTHER PUBLICATIONS

"Steady State Photovoltaic Effect in Asymmetrical Graded Superlattices," Liu, Physical Rev. Let. V. 67N. 16, Oct. 1991 pp. 2231-2234.
"Tunable Long-Wavelength Detectors Using Graded Barrier Quantum Wells Grown by Electron Beam Source Epitaxy", Levine et al., Applied Phys. Let. V. 57 No. 4, Jul. 1990 pp. 383-385.
"New Mode of IR Detection Using Quantum Wells", Coon et al. Applied Phy. Let. Sep. 1984 pp. 649-651.

Primary Examiner—David C. Nelms
Attorney, Agent, or Firm—Blakely, Sokoloff, Taylor & Zafman

[57] ABSTRACT

Photoelectric detector presenting a multiple quantum well structure, each quantum well comprising a first barrier made from a first semiconductor material, a well made from a second semiconductor material, and a second barrier made from a third semiconductor material, each semiconductor material being defined by its chemical composition, and the electric conductibility in the detector being ensured by propagation, from the first barrier to the second barrier, of given charge carriers in a given electronic band, presenting an energy extremum in each of the said materials. In accordance with the invention, said semiconductor materials are at least partly doped with carriers, the chemical composition of the first and third semiconductor materials being such that the difference in energy, between the energy extremum of the said electronic band in the first semiconductor material and the energy extremum of the said electronic band in the third semiconductor material, is greater in absolute value than the maximum energy of the optical longitudinal phonons in the second semiconductor material making up the well. Application: infrared detectors, especially in the range $2 \times 10^{13}$–$4 \times 10^{13}$ Hz.

10 Claims, 6 Drawing Sheets

QUANTUM WELL PHOTOELECTRIC DETECTOR WITH IMPROVED DETECTIVITY

This invention relates to a photoelectric detector of the type presenting a multiple quantum well structure.

One particularly advantageous application of the invention is in the field of infrared detectors, particularly in the frequency range $2 \times 10^{13}$ to $4 \times 10^{13}$ Hz.

Until very recently, detectors in the $2 \times 10^{13}$ to $4 \times 10^{13}$ Hz range were fabricated with materials composed of elements from columns II and VI of Mendeleyev's classification, chiefly HgCdTe. These materials present a forbidden band of the required width (between 100 and 200 meV) and exhibit remarkable detectivity. Their main drawback resides in the difficulty of realizing good quality contacts and p-n junctions, a drawback which has limited development of these devices using II-VI material-based detection. In particular, it is still unknown how to reliably produce photodetector matrices of sufficient size.

In the early eighties, it was suggested that for detection in the $2 \times 10^{13}$–$4 \times 10^{13}$ Hz range, intersub-band transitions in a quantum well should be used instead of interband transitions. This type of photoelectric detector presents very generally, a quantum well structure composed of a "first" barrier made in a first semiconductor material, a "well" made in a second semiconductor material, and a "second" barrier made in a third semiconductor material, each semiconductor material being defined by its chemical composition, and the electric conductibility in the detector being ensured by the propagation, in the first barrier to second barrier direction, of carriers of a given charge in a given electronic band presenting an energy extremum in each of the said materials.

In practice, quantum well photoelectric detectors are generally fabricated by successive epitaxy of different layers of the said semiconductor materials on a substrate.

In a quantum well, the confinement of the carriers in the direction of epitaxial growth causes the formation of quantified energy levels. For example, for a well width in the order of 5 nm in a system in which the first and third materials are composed of $Ga_{0.7}Al_{0.3}As$ and the second material GaAs, the separation obtained between the first two levels corresponds to the desired wavelength. For the above system, the carriers are electrons and the said electronic band the conduction band. If the wells are doped with donors, an electron population is then obtained on the fundamental level of the wells, and the system can then absorb provided that the incident light is correctly polarized; when the carriers are electrons, transitions are only authorized if the polarization has a component parallel to the direction of growth of the layers.

The basic principal of the quantum well photoelectric detector thus set forth was subsequently improved upon by numerous modifications. For example, the transitions do not in fact take place between two quantified levels in the well, but between a confined level and a miniband of levels above the barriers. In this way, there is a higher probability that the photoexcited electrons will contribute to the current flow.

B. F. Levine and al (Appl. Phys. Lett. 57(4), 1990, pp 383–385) also proposed introducing a limited dissymetry between the two barriers of the well in order to obtain a detector that was tuneable across a certain range of wavelength.

A further improvement consists in engraving a grating on the upper contact of the photodetector, the period of which, taking account of the selection rules, causes incident light to couple more efficiently with the multiple quantum wells.

In this way, benefiting from the advantages offered by the maturity of technological processes on GaAs-based materials, 256×256 photodetector matrices can be produced without too much difficulty. This type of matrix was proved at 60 degrees Kelvin. The thermal resolution of the image achieved is around 0.1 degrees Kelvin. This in itself is a major advantage over other competing systems.

However, easy fabrication of usable photoelectric detectors depends on raising the operating temperature as much as possible.

To arrive at this result, the detectivity of the quantum well detectors must be improved. This detectivity is influenced by different parameters, particularly the value of the intersub-band absorption coefficient. Different techniques have been suggested to improve this absorption coefficient, for example, by surrounding the wells with thin barriers of a composition different from that of the main barriers. However, gains and losses generally cancel out. In the preceding example, any gain in terms of absorption is lost in terms of the coefficient of transfer of electrons towards the barrier.

One of the fundamental limitations of the output of known quantum well detectors resides in the capture time in the well of a photoexcited electron in the miniband of the detector. In fact, the responsivity R of this type of structure can be very simply expressed as the absorption coefficient (a) multiplied by the probability of an electron returning to the contact without being trapped again in a well. If $\tau_{capt}$ is the mean capture time, and $\tau_{drift}$ the time taken by an electron to cross the structure, it follows that:

$$R \alpha a . \tau_{capt} / \tau_{drift} \quad (1)$$

The ratio $\tau_{capt}/\tau_{drift}$ will be denoted as g, gain coefficient. This means that if the mean capture time is longer than the drift time from one contact to the next, the detector will present gain. The detectivity of the photodetector depends not only on R, but also on the contribution of the noise i of the device's dark current. Experience shows that to a very close approximation i is shot noise; if Id is the dark current, it follows that:

$$i \alpha \sqrt{Id \cdot g} \text{ and}$$

$$D \alpha R/i \alpha \alpha \sqrt{g} / \sqrt{d}$$

The Applicant has analyzed in depth and measured by luminescence experiments determined over time to an accuracy better than a picosecond, the process by which an electron is trapped in a quantum well. The results of these investigations have shown that in a conventional structure the capture time is always extremely brief, about one picosecond, or less. The time taken by an electron to transit the structure is more in the order of 10 ps. This results in a limitation of the performance of quantum well detectors actually known.

An object of this invention is to propose a photoelectric detector presenting a multiple quantum well structure whose detectivity can be improved by modifying the structure, thereby increasing the capture time of photocreated carriers.

In accordance with the invention, a photoelectric detector presenting the above general quantum well structure is distinguishable in that said semiconductor materials are at least partly doped with carriers, the chemical composition of the first and third semiconductor materials being such that the absolute value of the difference in energy, at said barriers, between the energy extremum of the said electronic band in the first semiconductor material and the energy extremum of the said electronic band in the third semiconductor material, is larger than the maximum energy of the optical longitudinal phonons in the semiconductor material making up a well. In accordance with the invention, the structure is formed from an alternating stack of layers of the second semiconductor material separated by layers of a semiconductor material presenting, from the second barrier of one well to the first barrier of the following well, in the direction of the carriers, a chemical composition varying gradually from the composition of the third semiconductor material to that of the first semiconductor material.

Thus, instead of presenting barriers of identical composition, or nearly so, as in known quantum well detectors, the composition of the barriers of the photodetector in accordance with the invention varies in such a way that the energy of levels on one side of the well is greater by more than 50 meV, for the system GaAlAs/-GaAs for example, than the energy of the electrons on the other side. In this way, when the photoelectric detector of the invention is placed under an electric field, as is the case when it is in operation, carriers arriving at the edge of the wells are subject to two effects which limit their trapping probability:

their speed is increased because of the greater kinetic energy they acquired on passing through the discontinuity, their trapping probability is reduced by the emission of an optical phonon because even after this type of phonon has been emitted, the carrier will still be in the states of the miniband. Since the well is fairly narrow, any problems of ionisation by impact are virtually overcome.

Luminescence experiments, both continuous and with picosecond resolution, have made it possible to show the effectiveness of this type of structure in reducing capture ratios in a quantum well. According to the equation (1), output is increased by the same degree.

In quantum well structures making use of semiconductor materials meeting the general chemical formula $Ga_xAl_{1-x}As$, the carriers are preferably electrons from the conduction band. In this case, since the sign of the carriers is negative, the energy extremum of the conduction band in the second barrier is lower than the energy extremum of the conduction band in the first barrier.

It must be noted however that the invention presents the important advantage of allowing the fabrication of multiple quantum well photoelectric detectors in which the carriers are holes from the valence band. Such is the case of materials of general formula $Si_xGe_{1-x}$ whose compatibility with the silicon technology presents the advantage that the photodetectors thus obtained can be integrated with most usual silicon-based electronic components. For this type of system, the energy extremum of the valence band in the first barrier must be lower than the extremum energy of the valence band in the second barrier.

The following description, which should be read in conjunction with the attached drawings furnished as nonlimiting examples, will allow the reader to gain a better understanding of the invention and of the manner in which it can be fabricated. In these drawings.

FIGS. 1 to 5 relate to a single quantum well structure and are intended to facilitate understanding of the invention which relates to a multiple quantum well structure.

Figure 1:
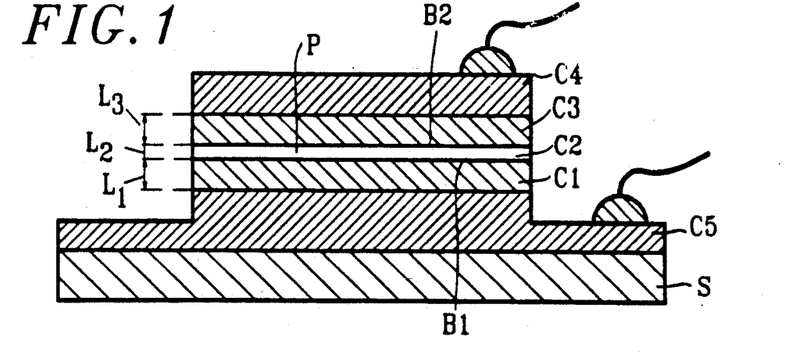
FIG. 1 is a cross-section of a quantum well photoelectric detector.

FIG. 1 shows a cross-section of a photoelectric detector structure with a single quantum well, given here to facilitate comprehension of the invention, composed of three superposed layers deposited on a substrate S, by means of a first electrical contact layer C5, namely a layer C1 of thickness L1 in a first semiconductor material forming a first barrier B1, a middle layer C2 of thickness L2 in a second semiconductor material forming the well P, and a layer C3 of thickness L3 in a third semiconductor material forming a second barrier B2. Layer C1 is covered by a second electrical contact layer C4.

Figure 2:
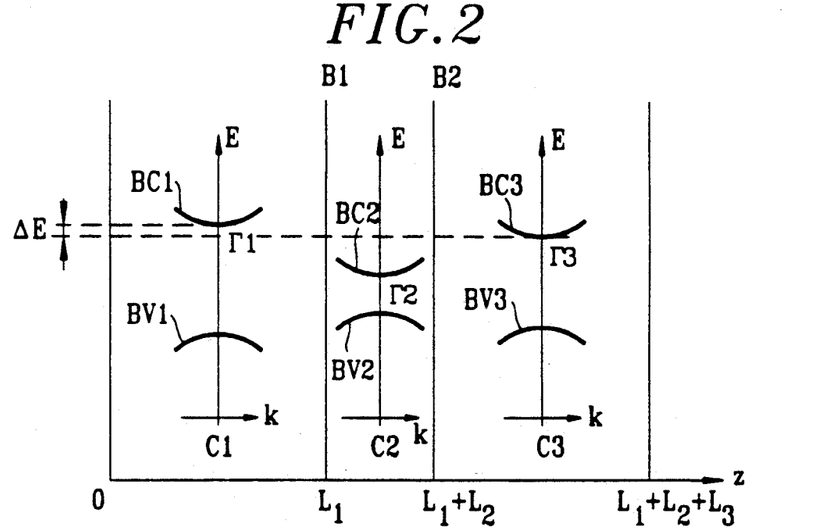
FIG. 2 is a diagram of the band structure in each layer of the photoelectric detector shown in FIG. 1.

The band structure in each layer C1, C2, C3 is shown in basic sketched form in FIG. 2, and shows conduction bands BC1, BC2 and BC3 and valence bands BV1, BV2 and BV3. In this kind of single quantum well structure, the composition of the semiconductor material remains constant throughout the whole thickness of each layer. In the diagram in FIG. 2, the conduction bands, for example, present respective extrema, in this case minimums, at Brillouin zone centres Γ1, Γ2 and Γ3.

The respective positions of the different electronic bands depend essentially on the chemical composition of the semiconductor materials. Electric conductibility in the photoelectric detector thus constituted is ensured by propagation of given charge carriers (electrons or holes), in a given electronic band (conduction band or valence band), in the first barrier B to second barrier B2 direction.

Figure 3:
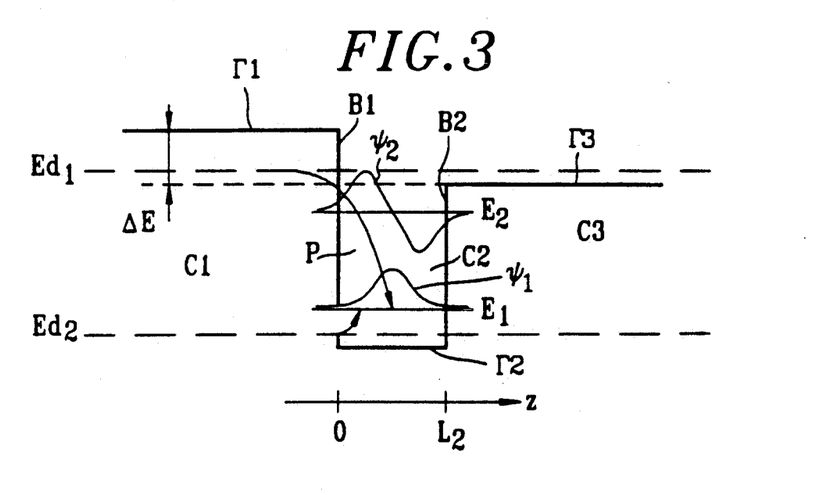
FIG. 3 is a first diagram of quantum wells under a null electric field.

FIG. 3 shows the energy diagram of a quantum well produced by the minimums Γ1, Γ2, Γ3 of conduction bands BC1, BC2, BC3, taken at the Brillouin zone center of each layer.

In the potential wells of layer C2, confinement of the carriers produces quantified energy levels E1, E2, ... En, etc... whose value can be roughly estimated from the following equation:

$$E_n = \frac{\hbar^2}{2m} \left(\frac{n\pi}{L_2}\right)^2 \quad n = 1, 2, \ldots$$

where h is the reduced Planck's constant and m the mass of the carriers.

It can be seen that the narrower the well, the larger the difference in energy between the two first levels E1 and E2. It is therefore possible to adjust the dimensions of the wells according to the detection wavelength desired.

The wave functions $\psi_n$ associated with energy levels $E_n$ can be approximated as follows:

$$\gamma_n = A \sin\left(\frac{n\pi z}{L_2}\right)^n \quad n = 1, 2, 3, \ldots$$

where a is a normalizing constant.

To populate the lowest level El of the quantum well structure in electrons, the semiconductor materials are doped with impurities which create either a donor level $E_{d1}$ in the region of conduction bands BC1 and BC3 of layers C1 and C3, or a donor level $E_{d2}$ in the proximity of fundamental layer E1. The electrons thus populate level $E_1$. Likewise, to populate the first levels of the valence band with holes, the semiconductor materials are doped in an appropriate manner with electron acceptors.

Figure 4:
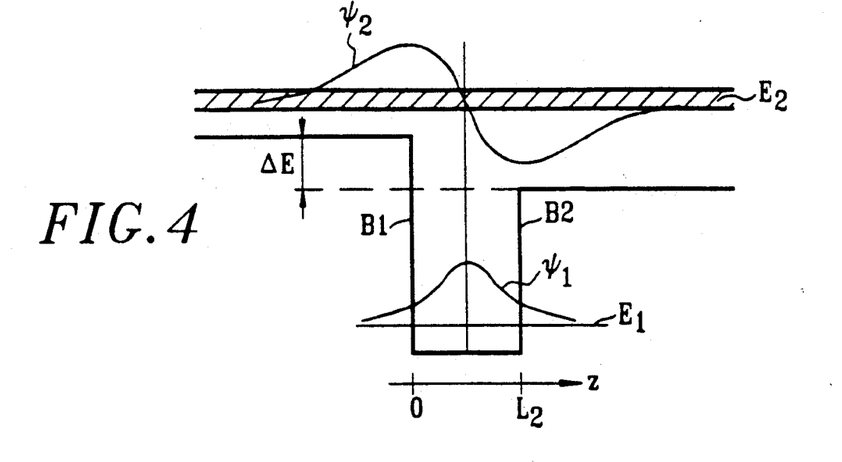
FIG. 4 is a second diagram of quantum wells under a null electric field.

In FIG. 3, energy level $E_2$, the first excited state of the quantum well structure, is seen to be confined to the inside of the wells; consequently the carriers which have moved there after absorbing an energy photon $h\nu = E_2 - E_1$, have a fairly low probability of propagating and therefore of contributing in any substantial way to the photoelectric signal. To increase this propagation probability, it is beneficial, as indicated in FIG. 4 in a null field, to realize the optical transitions between a confined level $E_1$ of the well and a miniband $E_2$ whose energy is greater than the height of the second barrier B2.

Figure 5:
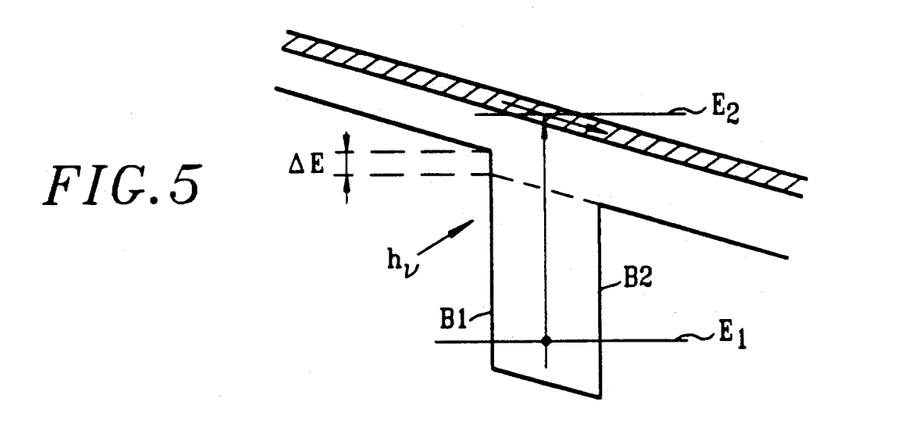
FIG. 5 is an operating diagram under a non-null electric field of the quantum well structure shown in FIG. 4.

In this last case, FIG. 5 shows the operating mechanism of the quantum well under a non-null electric field An energy photon hv is absorbed in the quantum well by a carrier, an electron for example, of energy $E_1$, to reach energy level $E_2$ in the miniband. The electron subjected to the external electric field applied can then propagate through the structure, but the electron circulating in the miniband has a certain probability, on passing through the well, of being trapped by the structure and returning to the minimum energy state $E_1$ of this well.

With a view to limiting this trapping probability, the composition of the first and third semiconductor materials is advantageously such that, at barriers B1 and B2, the energy of the minimum Γ1 of the conduction band BC1 in the first layer C1 of the first semiconductor material is greater than the energy of the minimum Γ3 of the conduction band BC3 in the third layer C3 of the third semiconductor material, the difference in energy ΔE being greater than the maximum energy of the optical longitudinal phonons in the second semiconductor material of quantum well P.

This quantum well structure in which the carriers are electrons and the electronic band the conduction band can be produced with the aid of gallium arsenide-based semiconductor materials of general formula $Ga_xAl_{1-x}As$. In particular, the formula of the first semiconductor material of the first layer C1 can be $Ga_{x1-1}Al_{1-x1}As$, that of the second semiconductor material of the second well layer C2 GaAs, and that of the third semiconductor material of the third layer C3 $Ga_{x3}Al_{1-x3}As$, where $x_1 > x_3$ and $x_1 - x_3 > 0.05$, in such a way as to have a difference in energy ΔE between barriers greater than 50 meV, itself larger than the energy of the optical longitudinal phonons in GaAs, AlAs and GaAlAs. Typically, $x_1$ and $x_3$ can be 0.25 and 0.2. For the purposes of an example, the thicknesses of the different layers can be $L_1 = L_3 = 0.1$ μm and $L_2 = 6$ nm.

Figure 6A:
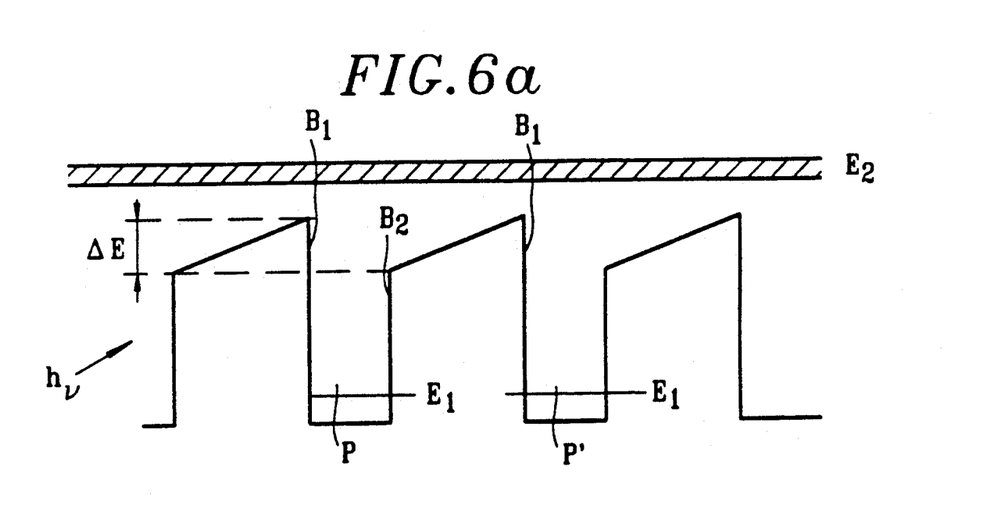
FIGS. 6a and 6b are diagrams of a multiple quantum well structure of the invention under an electric field respectively null and non-null.
Figure 6B:
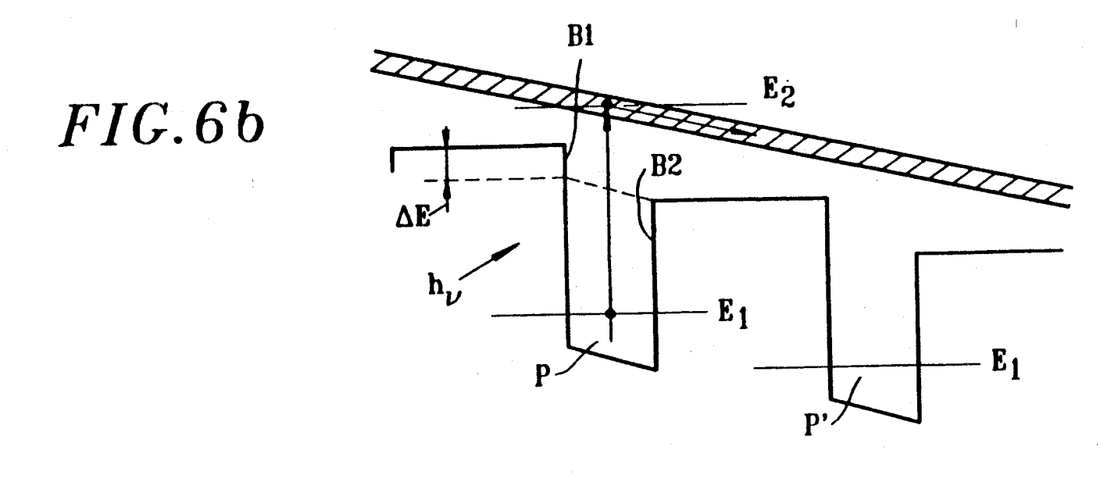

A multiple quantum well structure in accordance with the invention is shown in FIGS. 6a and 6b. This structure is formed from an alternating stack of layers of the second well semiconductor material, GaAs for example, separated by layers of a semiconductor material presenting, from the second barrier B2 of a well P to the first barrier B1 of the following well P', in the direction of carrier propagation, a chemical composition gradually varying between the composition of the third semiconductor material, $Ga_{x3}Al_{1-x3}As$ for example, to that of the first semiconductor material $Ga_{x1}Al_{1-x1}As$ for example, where $x_1 > x_3$.

It can be seen that in the structural diagram in FIG. 3 where the photoexcited level $E_2$ is a confined state in the quantum well, the transition $E_1 \rightarrow E_2$ presents a relatively high oscillatory force because of the large overlap between the corresponding wave functions. In contrast, the confinement of the excited state $E_2$ has the effect of limiting the probability, for the electron in the excited state $E_2$, of leaving the well and participating in the current flow. Conversely, the structure shown in FIG. 4 is more advantageous with regard to this probability, but the spreading of the wave function is such that the oscillatory force of the optical transition is weaker.

Figure 7:
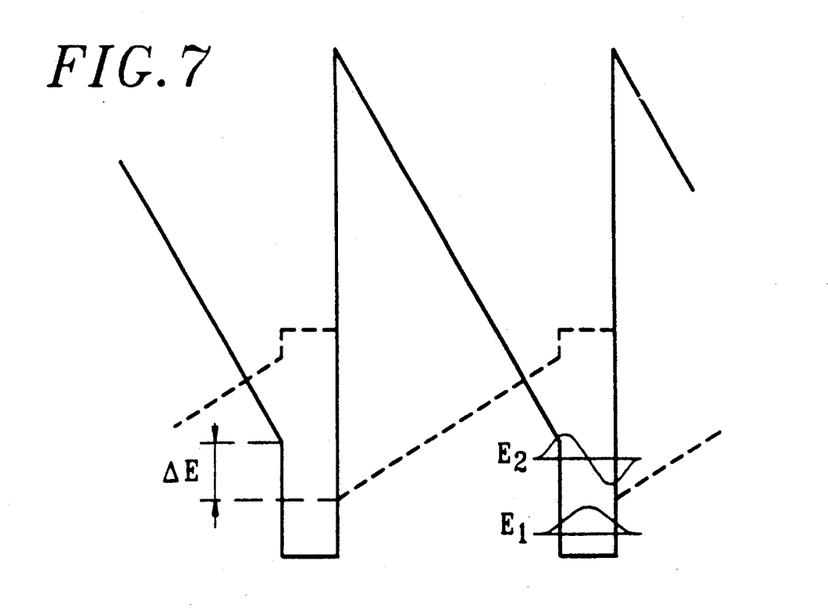
FIG. 7 is a diagram indicating the position under a null electric field of the extrema of the conduction band for a first structure in accordance with the invention, of multiple quantum wells with intersecting extrema Γ (solid line) and X (dotted line).
Figure 8:
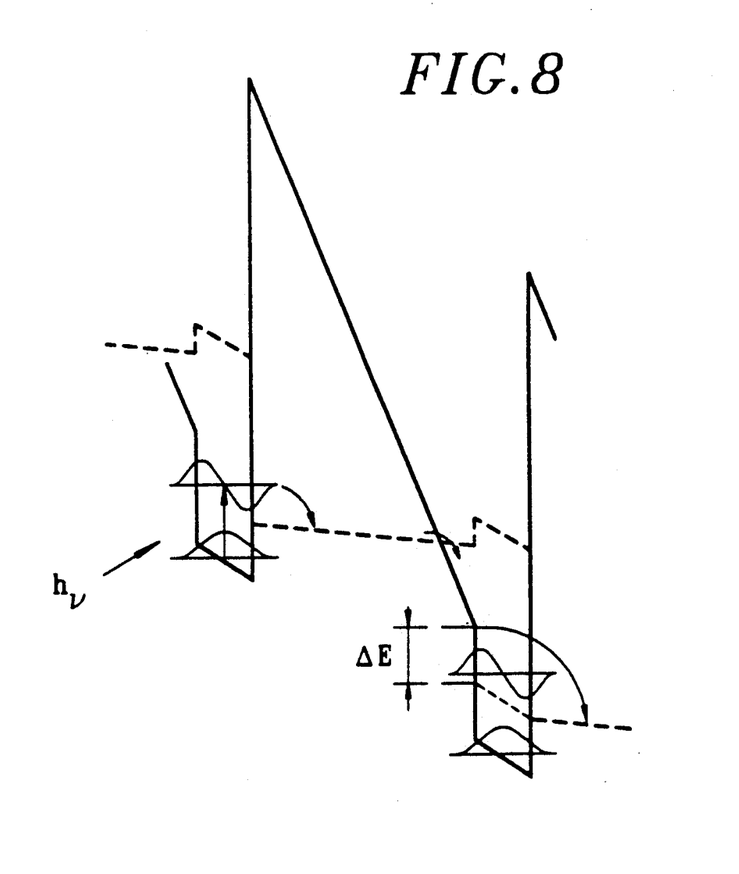
FIG. 8 is the operating diagram of the structure shown in FIG. 7.

The object of the alternative embodiment of the invention illustrated in FIGS. 7 and 8 is also to improve electric conductibility and at the same time optically increase the overlapping of wave functions of active states. To achieve this, the invention proposes confining the wave function of the energy state $E_2$, but authorizing the departure of photocreated carriers thanks to the presence of accessible energy levels corresponding to an extremum, in this case a minimum, at the Brillouin zone edge.

The structure shown in FIG. 7 comprises a quantum well layer composed of $Ga_{0.9}Al_{0.1}As$ for example, surrounded on either side by a layer of a semiconductor material whose composition varies gradually in the direction of conduction from AlAs, which is the said third semiconductor material, to, for example, $Ga_{0.7}Al_{0.3}As$ which is the said first semiconductor material, these compositions of course able to vary on condition that the minimum $\Gamma$ of the conduction band at the Brillouin zone center in the first material is greater than the minimum X of the conduction band at the Brillouin zone edge in the third material, the difference in energy $\Delta E$ between these two minimums being greater than the maximum energy of optical longitudinal phonons in GaAs. For a width of 9 nm and a $Ga_{0.9}Al_{0.1}As$ well composition, the detector operates in the region of $2.7 \times 10^{13}$ Hz.

The operating mechanism of this type of photodetector under an electric field is shown in FIG. 8. The optical transition between the confined states $E^1$ and $E^2$ is performed with a substantial oscillatory force. The photoelectron thus created propagates in the wells up to second barrier B2 and penetrates into the third material where, by non-radiative deexcitation, it rejoins the level $X_3$ of minimum energy in which it remains throughout its propagation in the layer of material of gradually varying composition until it crosses a minimum of the conduction band in the Brillouin zone center. The electron then continues its trajectory in this type of state and reaches the first barrier B1 where the quantum leap takes place above the well between the $\Gamma$ level of the first semiconductor material and the X level of the third semiconductor material.

Figure 9:
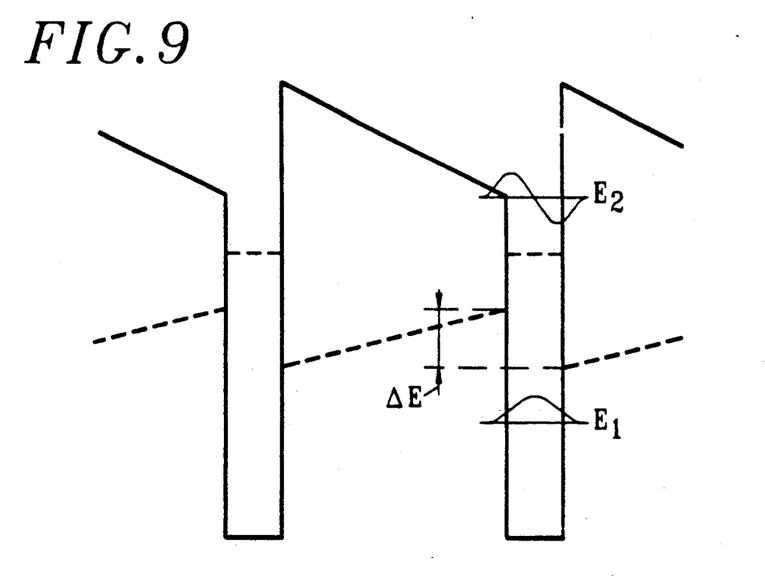
FIG. 9 is a diagram indicating the position under a null electric field of the extrema of the conduction band for a second structure in accordance with the invention, of multiple quantum wells with intersecting extrema Γ (solid line) and X (dotted line).
Figure 10:
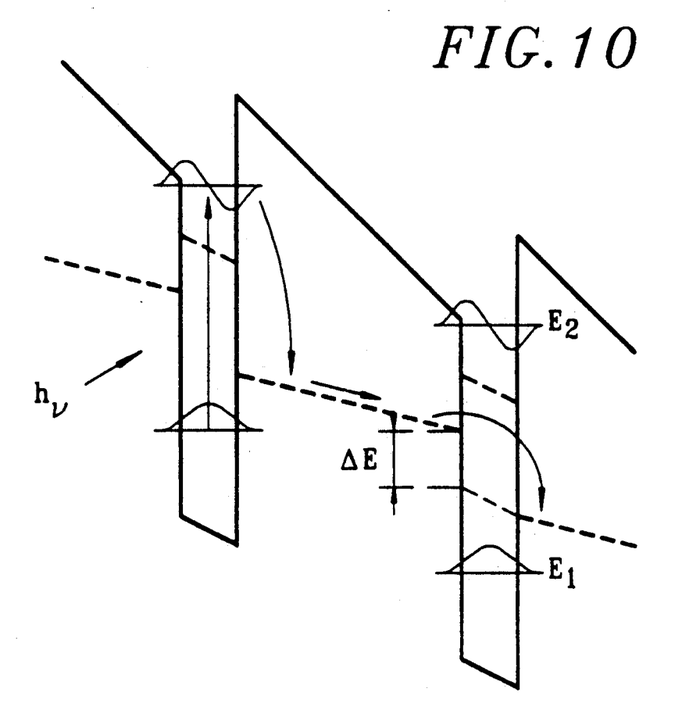
FIG. 10 is an operating diagram for the structure shown in FIG. 9.

FIGS. 9 and 10 show a photoelectric detector, similar in structure to that described in relation to FIGS. 7 and 8, whose responsitivity has been extended to the range $5 \times 10^{13} - 10^{14}$ Hz. The actual quantum well is realized by a GaAs layer surrounded by two layers whose composition gradually varies from a third semiconductor material of composition $Ga_{0.2}Al_{0.8}AS$ to a first semiconductor material of composition $Ga_{0.4}Al_{0.6}As$, for example. In this type of structure, it is essential that the minimum X of the conduction band at the Brillouin zone edge in the first material is greater than the minimum X of the conduction band at the Brillouin zone edge in the third material, the difference in energy $\Delta E$ between these two minimums being greater than the maximum energy of the optical longitudinal phonons in GaAs. For a 3 nm GaAs well, the detector operates in the region of $10^{14}$ Hz.

As shown in FIG. 10, when the photodetector is operating, an electron, moved up to the energy level $E_1$ after absorbing a photon from the range $5 \times 10^{13} - 10^{14}$ Hz, deexcites to reach a minimum X of the third semiconductor material and propagates in the variable composition layer up to the first barrier B1 where it is at a minimum X of the first semiconductor material. The passage from one level X to another through the quantum well is effected, in accordance with the arrangements of the present invention, by a potential jump.

The invention also applies to other systems of III-V compounds such as GaInAs/GaAlInAs, GaInAs/GaInAsP, GaSb/GaAlsb between the GaAs/GaAlAs system.

The invention can equally apply to photodetectors using holes of the valence band as majority carriers. It has in fact been shown that quantum well photoelectric detectors based on this principle exhibit good detectivity. Their essential merit is to allow implementation of the photodetector under normal incidence: indeed, the intravalance-band transition between the first level $E_1$ of heavy holes and the second level $E_2$ is permitted in this configuration.

Figure 11:
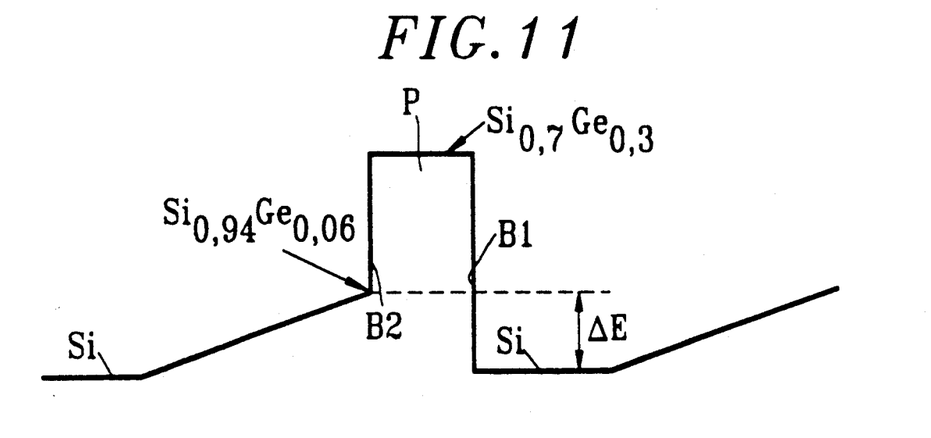
FIG. 11 is a diagram of the quantum well structure of a Si(Ge) photoelectric detector.
Figure 12:
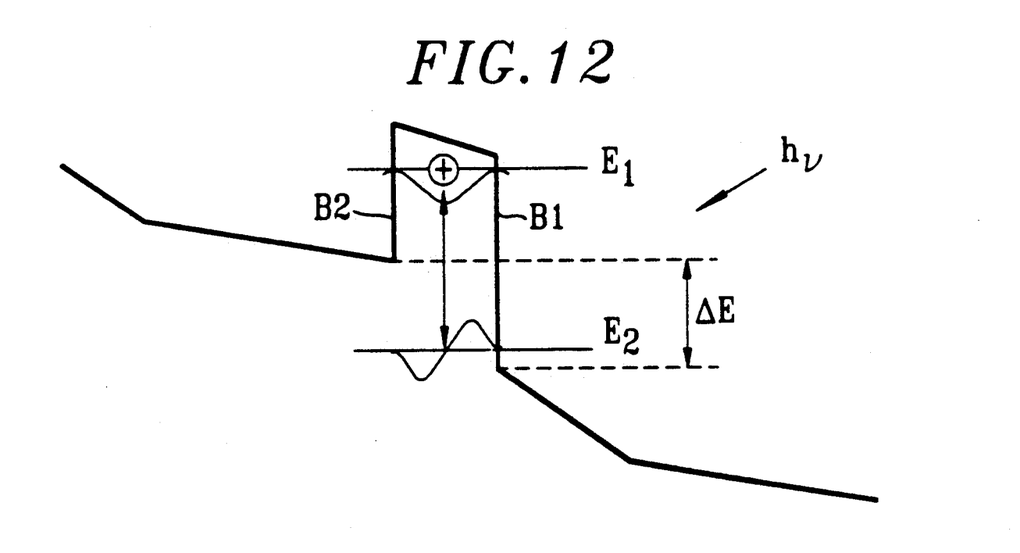
FIG. 12 is the operating diagram for the structure shown in FIG. 11.

The main problem of such a structure is the weak gain due to the slow drift speed of the holes. They have, as a result, a 80 to 100% chance of being trapped on passing a given well. A structure in accordance with the invention makes it possible to reduce this trapping probability as in the case of electrons. FIGS. 11 and 12 show a structure of this type which allows detection in the region of $2.7 \times 10^{13}$ Hz for semiconductor materials in the general form $Si_xGe_{1-x}$.

In this example, the first semiconductor material forming the first barrier B1 is a pure silicon layer (x=0). The actual quantum well P is composed of a 0.004 μm-thick layer of a second semiconductor material of formula $Si_{0.7}Ge_{0.3}$. Finally, the structure is completed by a third layer whose composition varies gradually from that of a third semiconductor material of formula $Si_{0.94}Ge_{0.06}$ at the second barrier B2, to that of pure silicon.

The energy diagram shown in FIGS. 11 and 12 is traced taking as a reference the maximums or valence bands at the center of the Brillouin zones for each of the semiconductor materials considered. The difference in energy $\Delta E$ between these maximums for the first and third materials is 60 meV, this value being greater than the maximum energy of optical longitudinal photons of silicon which is 57 meV.

The transition between the confined state $E_1$ and the resonant state $E_2$ at the edge of the well occurs around the frequency $2.7 \times 10^{13}$ Hz.

This particular case of a quantum well photoelectric detector is particularly significant since it can, in principle, be easily integrated with VLSI control and processing electronics.

We claim:

1. Photoelectric detector presenting a multiple quantum well structure, each quantum well comprising a first barrier made from a first semiconductor material, a well made from a second semiconductor material, and a second barrier made from a third semiconductor material, each semiconductor material being defined by its chemical composition, and the electric conductibility in the detector being ensured by propagation, from the first barrier to the second barrier, of given charge carriers in a given electronic band, presenting an energy extremum in each of the said materials, said semiconductor materials being at least partly doped with carriers, the chemical composition of the first and third semiconductor materials being such that the difference in energy, at the said barriers, between the energy extremum of the said electronic band in the first semiconductor material and the energy extremum of the said electronic band in the third semiconductor material is greater in absolute value than the maximum energy of the optical longitudinal phonons in the second semiconductor material making up the well, said structure being formed from an alternating stack of layers of the second semiconductor material separated by layers of a semiconductor material presenting, from the second barrier of one well to the first barrier of the following well, in the direction of carrier propagation, a chemical composition that gradually varies between the composition of the third semiconductor material to that of the first semiconductor material.

2. Photoelectric detector as claimed in claim 1, wherein the said semiconductor materials are at least partly doped with donors, said carriers being electrons and said electronic band the conduction band.

3. Photoelectric detector as claimed in claim 2, wherein the said energy extremum of the said electronic band in said first semiconductor material is the minimum $\Gamma_1$ of the conduction band at the Brillouin zone center, and wherein said extremum of said electronic band in the third semiconductor material is the minimum $\Gamma_3$ of the conduction band at the Brillouin zone center.

4. Photoelectric detector as claimed in claim 2, wherein said energy extremum of the said electronic band in said first semiconductor material is the minimum $\Gamma_1$ of the conduction band at the Brillouin zone center, and wherein said energy extremum of the said electronic band in said third semiconductor material is the minimum X of the conduction band in the Brillouin zone edge.

5. Photoelectric detector as claimed in claim 2, wherein the said energy extremum of said electronic band in said first semiconductor material is the minimum X of the conduction band in the Brillouin zone edge, and wherein the energy extremum of the said electronic band in said third semiconductor material is the minimum X of the conduction band in the Brillouin zone edge.

6. Photoelectric detector as claimed in claim 1, wherein said semiconductor materials are at least partly doped with acceptors, said carriers being holes and said electronic band the valence band.

7. Photoelectric detector as claimed in claim 6, wherein said energy extremum of said electronic band in said first semiconductor material is the maximum of the valence band at the Brillouin zone center, and wherein said energy extremum of said electronic band in s id third material is the maximum of the valency band at the Brillouin zone center.

8. Photoelectric detector as claimed in claim 2, wherein said semiconductor materials are compounds of elements from columns III and V of the periodic classification of elements.

9. Photoelectric detector as claimed in claim 8, wherein said semiconductor materials comply with the general chemical formula $Ga_xAl_{1-x}As$.

10. Photoelectric detector as claimed in claim 6, wherein said semiconductor materials comply with the general chemical formula $Si_xGe_{1-x}$.

* * * * *

UNITED STATES PATENT AND TRADEMARK OFFICE
CERTIFICATE OF CORRECTION

PATENT NO. : 5,296,699
DATED : March 22, 1994
INVENTOR(S) : Deveaud-Pledran et al.

It is certified that error appears in the above-identified patent and that said Letters Patent is hereby corrected as shown below:

In column 5 at line 18 delete "Pianck's constant" insert --Planck's--.

In column 5 at line 30 delete

"$\gamma_n = A \sin (n\pi z/L_2)^n \quad n = 1,2,3, \ldots$", insert --$\psi_n = A \sin (n\pi z/L_2)^n \quad n = 1,2,3, \ldots$--

Signed and Sealed this

Tenth Day of October, 1995

*Attest:*

BRUCE LEHMAN

*Attesting Officer*  *Commissioner of Patents and Trademarks*